United States Patent
Yoon et al.

(10) Patent No.: US 11,522,069 B2
(45) Date of Patent: Dec. 6, 2022

(54) THIN-FILM SEMICONDUCTORS

(71) Applicant: UNIVERSITY OF UTAH RESEARCH FOUNDATION, Salt Lake City, UT (US)

(72) Inventors: Heayoung Yoon, Salt Lake City, UT (US); David Magginetti, Salt Lake City, UT (US)

(73) Assignee: UNIVERSITY OF UTAH RESEARCH FOUNDATION, Salt Lake City, UT (US)

(*) Notice: Subject to any disclaimer, the term of this patent is extended or adjusted under 35 U.S.C. 154(b) by 153 days.

(21) Appl. No.: 16/881,500

(22) Filed: May 22, 2020

(65) Prior Publication Data

US 2020/0373414 A1 Nov. 26, 2020

Related U.S. Application Data

(60) Provisional application No. 62/851,895, filed on May 23, 2019.

(51) Int. Cl.
*H01L 29/66* (2006.01)
*H01L 29/786* (2006.01)
*H01L 21/02* (2006.01)

(52) U.S. Cl.
CPC .. *H01L 29/66742* (2013.01); *H01L 21/02417* (2013.01); *H01L 29/786* (2013.01)

(58) Field of Classification Search
CPC ......... H01L 21/02417; H01L 21/02485; H01L 21/02631; H01L 21/02568
See application file for complete search history.

(56) References Cited

U.S. PATENT DOCUMENTS

| | | | |
|---|---|---|---|
| 4,388,483 A * | 6/1983 | Basol | H01L 31/1828 205/159 |
| 2013/0133734 A1 | 5/2013 | Peter et al. | |
| 2013/0306132 A1 | 11/2013 | Peng et al. | |
| 2016/0060785 A1 | 3/2016 | Wang | |
| 2016/0064582 A1 | 3/2016 | Kim et al. | |
| 2018/0367089 A1 | 12/2018 | Stutterheim et al. | |
| 2019/0044009 A1* | 2/2019 | Yeom | H01L 31/112 |
| 2019/0067005 A1* | 2/2019 | Yun | C23C 16/45553 |

(Continued)

OTHER PUBLICATIONS

Behr et al., "Growth model for the molecular beam epitaxial growth of CdTe using reflection high energy electron diffraction oscillation measurements," J. Cryst. Growth, Nov. 1995, 156(3): 206-211.

(Continued)

*Primary Examiner* — Julia Slutsker
(74) *Attorney, Agent, or Firm* — Michael Best & Friedrich LLP

(57) ABSTRACT

Systems and methods disclosed and contemplated herein relate to manufacturing thin film semiconductors. Resulting thin film semiconductors are particularly suited for applications such as flexible optoelectronics and photovoltaic devices. Broadly, methods and techniques disclosed herein include high-temperature deposition techniques combined with lift-off in aqueous environments. These methods and techniques can be utilized to incorporate thin film semiconductors into substrates that have limited temperature tolerances.

16 Claims, 15 Drawing Sheets

(56) References Cited

U.S. PATENT DOCUMENTS

2019/0067502 A1 2/2019 Mashayamombe
2021/0399146 A1* 12/2021 Park ................ H01L 21/02568

OTHER PUBLICATIONS

Bergmann et al., "On the origin of logarithmic-normal distributions: An analytical derivation, and its application to nucleation and growth processes," J. Cryst. Growth, Jun. 2008, 310(13): 3135-3138.

Card et al., "On the physics of moisture-induced cracking in metal-glass (copper-silica) interfaces," J. Appl. Phys., 2007, 102: 053516.

Chantana et al., "Flexible Cu(In,Ga)Se-2 solar cell with superstrate-type configuration fabricated by a lift-off process,"Thin Solid Films, 2018, 662: 110-115.

Consonni et al., "Local band bending and grain-to-grain interaction induced strain nonuniformity in polycrystalline CdTe films," Phys. Rev. B, Jan. 2014, 89: 035310.

Enríquez et al., "S and Te inter-diffusion in CdTe/CdS hetero junction," Sol. Energy Mater. Sol. Cells Sep. 2007, 91(15-16): 1392-1397.

Espiau De Lamaestre et al., "Diffusion properties of chalcogens (S, Se, Te) into pure silica," J. Non-Cryst. Solids, Oct. 2005, 351(57-39): 3031-3036.

Faraj et al., "Comparison of cadmium sulfide thin films deposited on glass and polyethylene terephthalate substrates with thermal evaporation for solar cell applications," J. Mater. Sci. Mater. Electron., 2012, 23: 1219-1223.

Feng et al., "On the Stoney Formula for a Thin Film/Substrate System With Nonuniform Substrate Thickness," J. Appl. Mech., Nov. 2007, 74(6): 1276-1281.

First Solar, "First Solar Achieves Yet Another Cell Conversion Efficiency World Record," First Solar, Feb. 2016, <https://investor.firstsolar.com/news/press-release-details/2016/First-Solar-Achieves-Yet-Another-Cell-Conversion-Efficiency-World-Record/default.aspx>.

Fuertes Marrón et al., "Lift-off process and rear-side characterization of CuGaSe2 chalcopyrite thin films and solar cells," J. Appl. Phys., 2005, 97: 094915.

Girish Kumar et al., "Physics and chemistry of CdTe/CdS thin film heterojunction photovoltaic devices: fundamental and critical aspects," Energy Environ. Sci., 2014, 7: 45-102.

Green et al., "Solar cell efficiency tables (Version 53)," Prog. Photovolt. Res. Appl., 2019, 27: 3-12.

Hagmann, "Empa—Communication—Efficiency record for flexible CdTe solar cell due to novel polyimide film," Empa, Jun. 2011, <https://www.empa.ch/web/s604/solarzellen>.

Kim et al., "Highly efficient and bending durable perovskite solar cells: toward a wearable power source," Energy Environ. Sci., 2015, 8: 916-921.

Kim et al., "Reaction kinetics study of CdTe thin films during CdCl2 heat treatment," Sol. Energy Mater. Sol. Cells, Aug. 2011, 95(8): 2295-2301.

Kranz et al., "Doping of polycrystalline CdTe for high-efficiency solar cells on flexible metal foil," Nat. Commun., Aug. 2013, 4: 2306.

Lamb et al., "Proton irradiation of CdTe thin film photovoltics deposited on cerium-doped space glass," Prog. Photovolt. Res. Appl., 2017, 25(12): 1059-1067.

Lee et al., "Peel-and-Srick: Fabricating Thin Film Solar Cell on Universal Substrates," Scientific Reports, Dec. 2012, 2: 1000, 4 pages.

Lee et al., "Transfer Printing Methods for Flexible Thin Film Solar Cells: Basic Concepts and Working Principles," ACS Nano, Sep. 2014, 8(9): 8746-8756.

Li et al., "S-Te Interdiffusion within Grains and Grain Boundaries in CdTe Solar Cells," IEEE J. Photovolt., Nov. 2014, 4(6): 1636-1643.

Li et al., "Wearable energy-smart ribbons for synchronous energy harvest and storage," Nat. Commun., Nov. 2016, 7: 13319.

Luschitz et al., "CdTe thin film solar cells: Interrelation of nucleation, structure, and performance," Thin Solid Films, Feb. 2009, 517(7): 2125-2131.

Luschitz et al., "Growth regimes of CdTe deposited by close-spaced sublimation for application in thin film solar cells," Thin Solid Films, May 2007, 515(15): 5814-5818.

Mahabaduge et al., "High-efficiency, flexible CdTe solar cells on ultra-thin glass substrates," Appl. Phys. Lett., 2015, 106: 133501.

Major, "Grain boundaries in CdTe thin film solar cells: a review," Semicond. Sci. Technol., Jul. 2016, 31(9): 093001.

McGott et al., "Thermomechanical Lift-Off and Recontacting of CdTe Solar Cells," ACS Appl. Mater. Interfaces, 2018, 10: 44854-44861.

Minemoto et al., "Layer Transfer of Cu(In,Ga)Se2 Thin Film and Solar Cell Fabrication," Japan J. Appl. Phys., Jan. 2010, 49: 012301.

Mohanty et al., "van der Waals epitaxy of CdTe thin film on graphene," Appl. Phys. Lett., 2016, 109: 143109.

Ohata et al., "Optical Energy Gap of the Mixed Crystal $CdS_xTe_{1-x}$," Japanese J. Appl. Phys., 1973, 12(10): 1641.

Paudel et al., "Thin-film CdTe detector for microdosimetric study of radiation dose enhancement at gold-tissue interface," J. Appl. Clin. Med. Phys. 2016, 17(5): 500-508.

Paulson et al., "Study of in situ CdCl2 treatment on CSS deposited CdTe films and CdS/CdTe solar cells," Thin Solid Films, Jul. 2000, 370: 299-306.

Perkins et al., "Two-Dimensional Cadmium Chloride Nanosheets in Cadmium Telluride Solar Cells," ACS Appl. Mater. Interfaces, May 2017, 9(24): 20561-20565.

Reese et al., "Increasing markets and decreasing package weight for high-specific-power photovoltaics," Nat. Energy, Nov. 2018, 3: 1002-1012.

Romeo et al., "Low substrate temperature CdTe solar cells: A review," Sol. Energy, Nov. 2018, 175: 9-15.

Salavei et al., "Comparison of high efficiency flexible CdTe solar cells on different substrates at low temperature deposition," Sol. Energy, Sep. 2016, 139: 13-18.

Slaoui et al., "Photovoltaics: advanced inorganic materials," in Ref. Module Mater. Sci. Mater. Eng., Elsevier, 2016, 11 pages.

Sosa et al., "Mipar™: 2D and 3D Image Analysis Software Designed by Materials Scientists, for All Scientists," Microsc. Microanal., Jul. 2017, 23: 230-231.

Stoppa et al., "Wearable electronics and smart textiles: a critical review," Sensors Jul. 2014, 14(7): 11957-11992.

Toby et al., "GSAS-II: the genesis of a modern open-source all purpose crystallography software package," Journal of Applied Crystallography, Apr. 2013, 46(2): 544-549.

Vasko et al., "All-sputtered CdS/CdTe solar cells on polyimide," in 2009 34th IEEE Photovolt. Spec. Conf. PVSC, 2009, pp. 001552-001555.

Voss et al., "Feasibility of energy harvesting techniques for wearable medical devices," in 2014 36th Annu. Int. Conf. IEEE Eng. Med. Biol. Soc., 2014, pp. 626-629.

Wie et al., "Wafer-recyclable, environment-friendly transfer printing for large-scale thin-film nanoelectronics," Proc. Natl. Acad. Sci., 2018, 115(31): E7236-E7244.

Wolden et al., "Photovoltaic manufacturing: Present status, future prospects, and research needs," J. Vac. Sci. Technol. Vac. Surf. Films, 2011, 29(3): 030801.

Xin et al., "Investigation of the evolution of single domain (111)B CdTe films by molecular beam epitaxy on miscut (001)Si substrate," J. Appl. Phys., 1998, 84: 4292.

Yan et al., "Influence of substrate structure on the growth of CdTe thin films," J. Appl. Phys., 2001, 89: 5944.

Zhang et al., "Integrated polymer solar cell and electrochemical supercapacitor in a flexible and stable fiber format, "Adv. Mater., Jan. 2014, 26(3): 466-470.

* cited by examiner

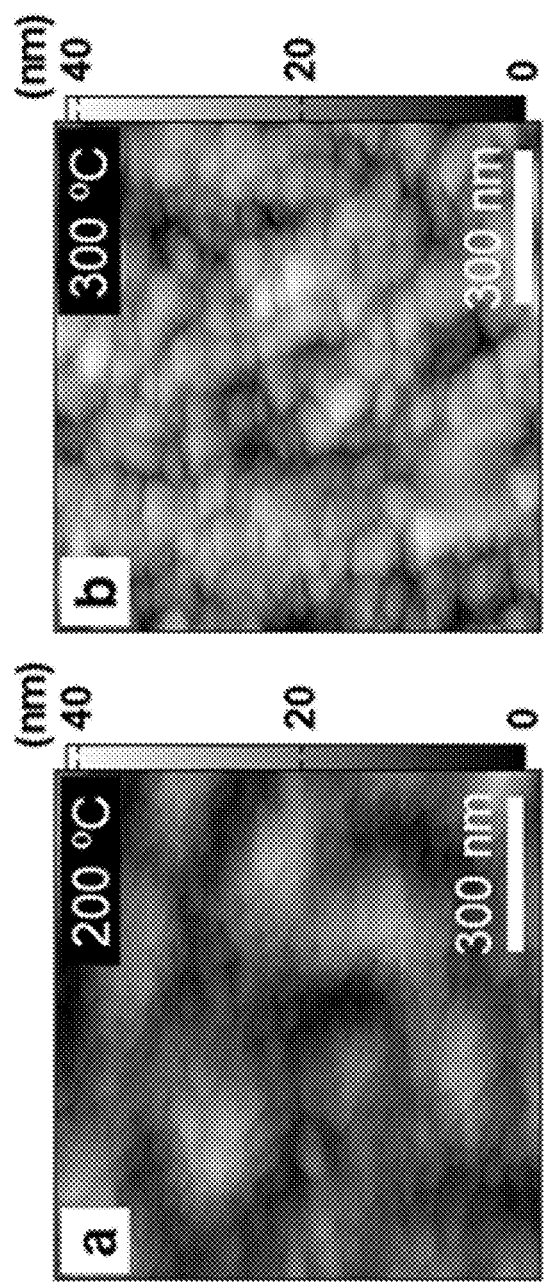
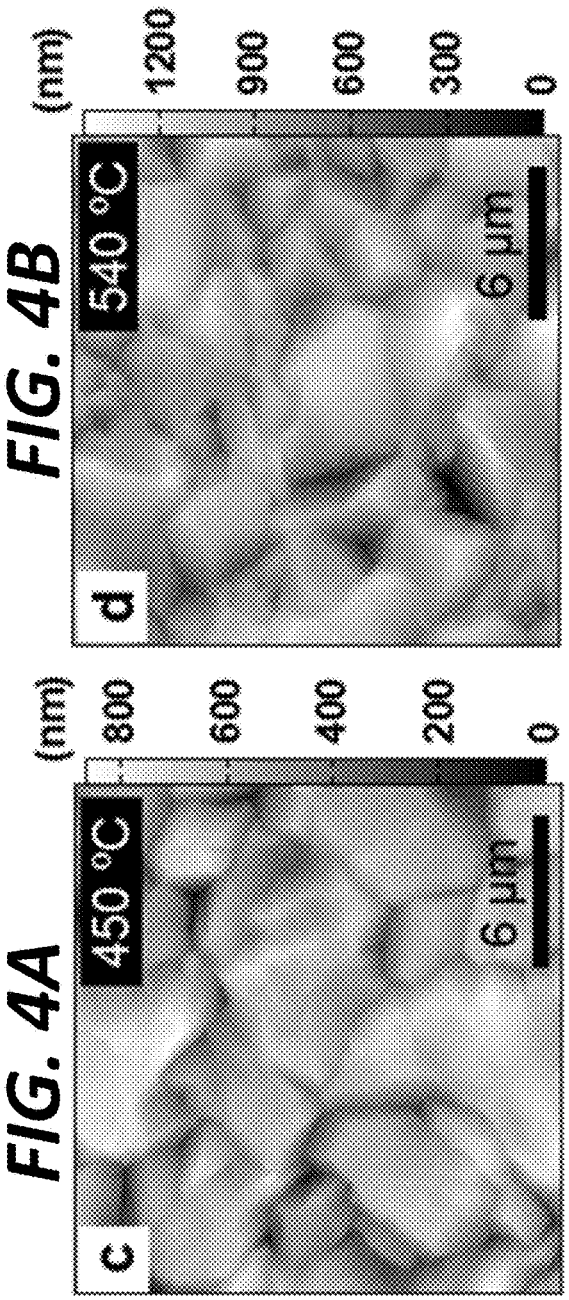
FIG. 4A  FIG. 4B  FIG. 4C  FIG. 4D

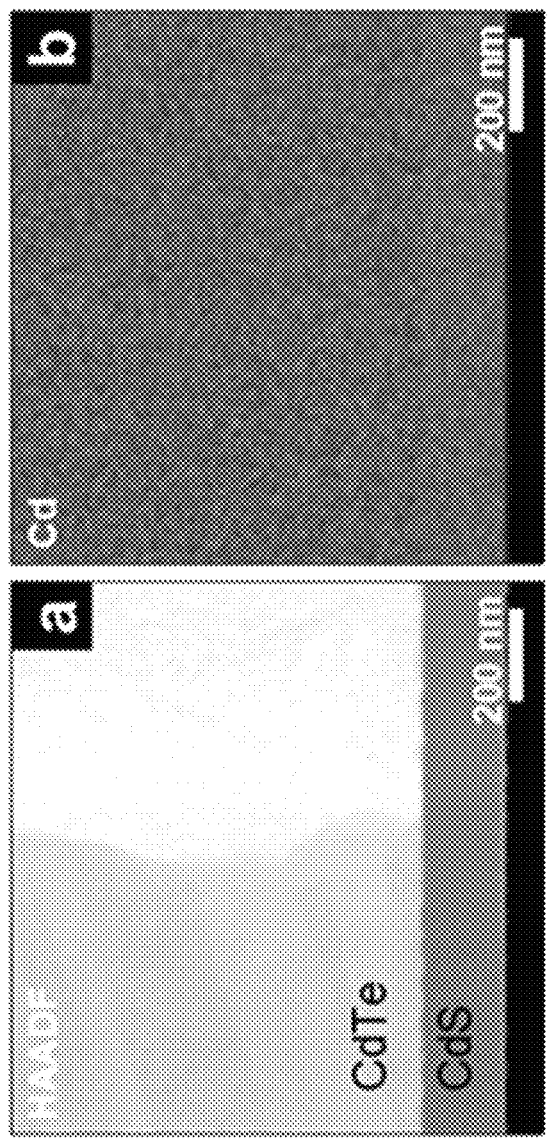
FIG. 9A
FIG. 9B
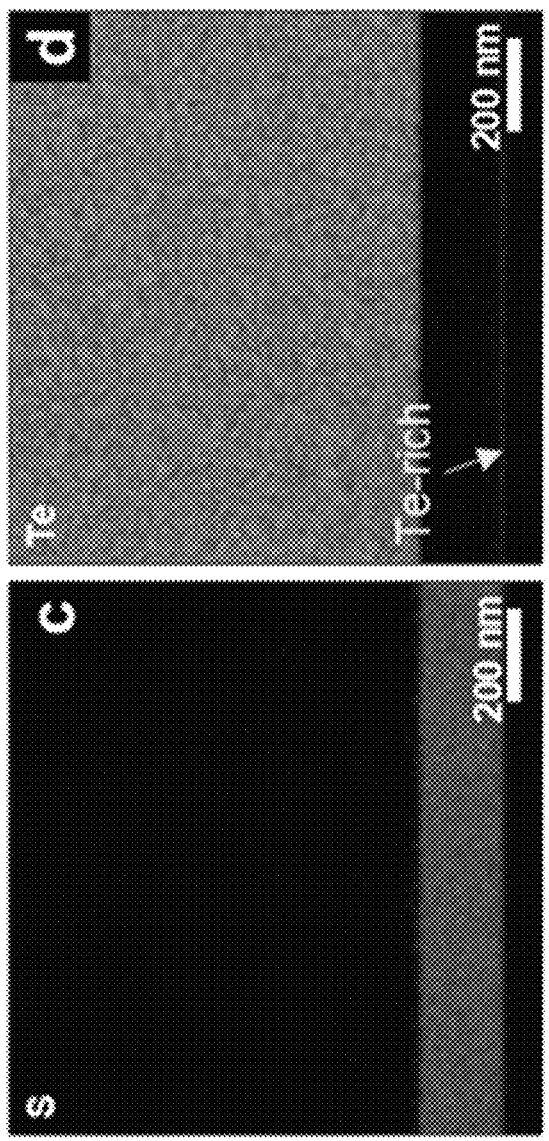
FIG. 9C
FIG. 9D

THIN-FILM SEMICONDUCTORS

CROSS-REFERENCE TO RELATED APPLICATION

The present application is related to and claims the priority benefit of U.S. Provisional Patent Application No. 62/851,895, filed May 23, 2019, the entire contents of which are hereby incorporated by reference.

GOVERNMENT INTEREST

This invention was made with government support under Grant number 1711885 awarded by the National Science Foundation. The government has certain rights in the invention.

TECHNICAL FIELD

The present disclosure relates to systems and methods for making thin-film semiconductors. In some aspects, methods disclosed and contemplated herein relate to making thin-film semiconductors using aqueous media-assisted lift-off.

INTRODUCTION

Chalcogenide thin-film semiconductor materials include cadmium telluride (CdTe), cadmium sulfide (CdS)/CdTe, and cadmium selenide (CdSe)/CdTe. These materials can be used in lightweight and flexible optoelectronic devices and solar cells owing to their effective light absorption and cost-effective manufacturing processes. Recent advances in design and process optimizations have enabled the production of CdTe devices on flexible substrates, but the necessary high-temperature processing (greater than 450° C.) that improve microstructural properties in such devices still limits the use of emerging alternative substrates made with conventional plastic, cellulous papers, and fabric.

SUMMARY

In one aspect, a method of making a thin film is disclosed. The method can include depositing a first cadmium layer onto a substrate, depositing a second cadmium layer onto the first cadmium layer, thereby generating a coated substrate, immersing the coated substrate in an aqueous medium, and, after immersing the coated substrate, removing a delaminated layer from the substrate, the delaminated layer including the first cadmium layer and the second cadmium layer.

In another aspect, a thin film is disclosed. The thin film may be made by a method including depositing a first cadmium layer onto a substrate, depositing a second cadmium layer onto the first cadmium layer, thereby generating a coated substrate, immersing the coated substrate in an aqueous medium, and, after immersing the coated substrate, removing a delaminated layer from the substrate, the delaminated layer including the first cadmium layer and the second cadmium layer.

In another aspect, a method of making a thin film is disclosed. The method may include depositing a first cadmium layer onto a substrate, where a substrate temperature is 20° C. to 25° C. while the first cadmium layer is deposited onto the substrate; depositing a second cadmium layer onto the first cadmium layer, thereby generating a coated substrate, where the substrate temperature is at least 400° C. and no more than 540° C. while the second cadmium layer is deposited onto the substrate; immersing the coated substrate in an aqueous medium; and, after immersing the coated substrate, removing a delaminated layer from the substrate, the delaminated layer including the first cadmium layer and the second cadmium layer There is no specific requirement that a material, technique or method relating to thin-film semiconductors include all of the details characterized herein, in order to obtain some benefit according to the present disclosure. Thus, the specific examples characterized herein are meant to be exemplary applications of the techniques described, and alternatives are possible.

BRIEF DESCRIPTION OF THE DRAWINGS

FIG. 4A-FIG. 4D show atomic force microscopy (AFM) topographic images of representative CdTe films deposited on a 200 nm CdS coated $Si/SiO_2$ substrates, at a substrate temperature of (FIG. 4A) 200° C., (FIG. 4B) 300° C., (FIG. 4C) 450° C., and (FIG. 4D) 540° C.

FIG. 9A-FIG. 9D are STEM images and simultaneously collected EDX maps of Cd-L (FIG. 9B), S-K (FIG. 9C), and Te-L (FIG. 9D) collected on a lamella sample (≈80 nm).

DETAILED DESCRIPTION

Figure 1:
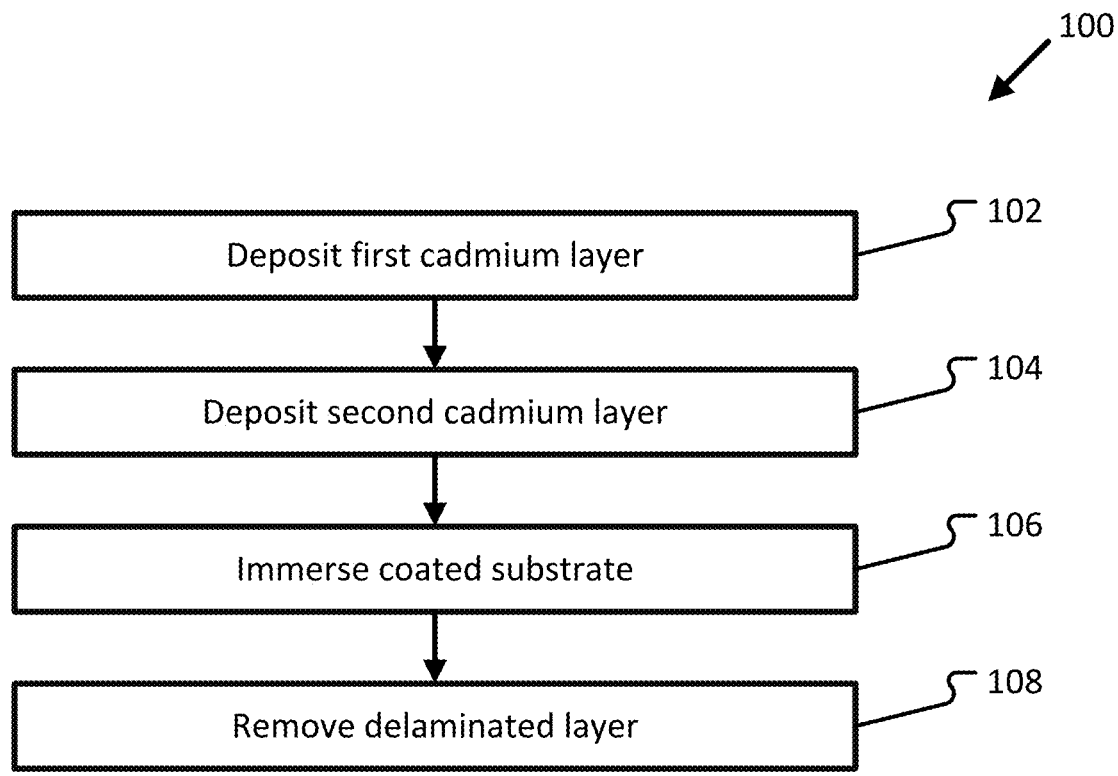
FIG. 1 shows an example method for making a thin film.

Systems and methods disclosed and contemplated herein relate to manufacturing thin film semiconductors. Resulting thin film semiconductors are particularly suited for applications such as flexible optoelectronics and photovoltaic devices. Broadly, methods and techniques disclosed herein include high-temperature deposition techniques combined with lift-off in aqueous environments. These methods and techniques can be utilized to incorporate thin film semiconductors into substrates that have limited temperature tolerances.

Chalcogenide and chalcopyrite thin-film semiconductors can be used for flexible optoelectronics and photovoltaic (PV) devices owing to their superior light absorption and cost-effective manufacturing processes. Direct band-gap ($\approx$1.5 eV) cadmium telluride (CdTe) is one such PV absorber that effectively captures usable sunlight with two orders of magnitude less material (<3 µm) comparing to conventional Si (>200 µm) crystalline semiconductors. With an aim to further increase the specific power (kW kg$^{-1}$) and mechanical flexibility, previous activities have focused on the development of low-temperature PV fabrications (<450° C.) for lightweight and flexible substrates, including polymer, fabric, and metal foils. However, the overall performances of such devices are still inferior to those fabricated via high-temperature deposition methods including close-spaced sublimation above 500° C. (efficiency >22%).

It has been suggested that the low performance is primarily attributed to superstrate device geometry and also to the microstructure/interface properties of CdTe that are not fully activated. High-temperature (>450° C.) deposition and the post-annealing processes radically improves the properties of microstructures and heterojunction interfaces of CdTe thin-films through grain recrystallization and surface passivation mechanisms. However, the mechanical fragility and the high substrate cost remain challenges as power generation units in emerging wearable electronics and integrated smart systems.

Transfer methods that decouple thin-film deposition and integration have been proposed and demonstrated. For example, one method involves delamination of a full stack of Cu(In, Ga)Se$_2$ solar cell from a glass substrate via addition and mechanical pulling of a copper secondary substrate. The presence of an MoSe$_2$ layer between the Mo and Cu(In, Ga)Se$_2$ appears to facilitate this mechanical lift-off process. Another method involves a large-area CdTe PV transfer using a thermomechanical method, where a controlled stressor of polymeric handle on the completed CdTe films enabled the mechanical peeling-off of the film in liquid nitrogen (77 K). Likewise for the Cu(In, Ga)Se$_2$ system, it was suggested that the delamination of CdTe is attributed to the formation of transition-metal dichalcogenide (e.g., CdCl$_2$) at the interface.

Although these methods demonstrated approaches to transfer high-quality PV materials and devices fabricated via high-temperature processes onto flexible substrates of interest, the debonding process in liquid nitrogen and/or the uncontrolled mechanical stress from the additional polymer layer may cause microstructural cracks and deformation, possibly influencing device performance.

I. Exemplary Methods of Making Thin Films

Figure 2:
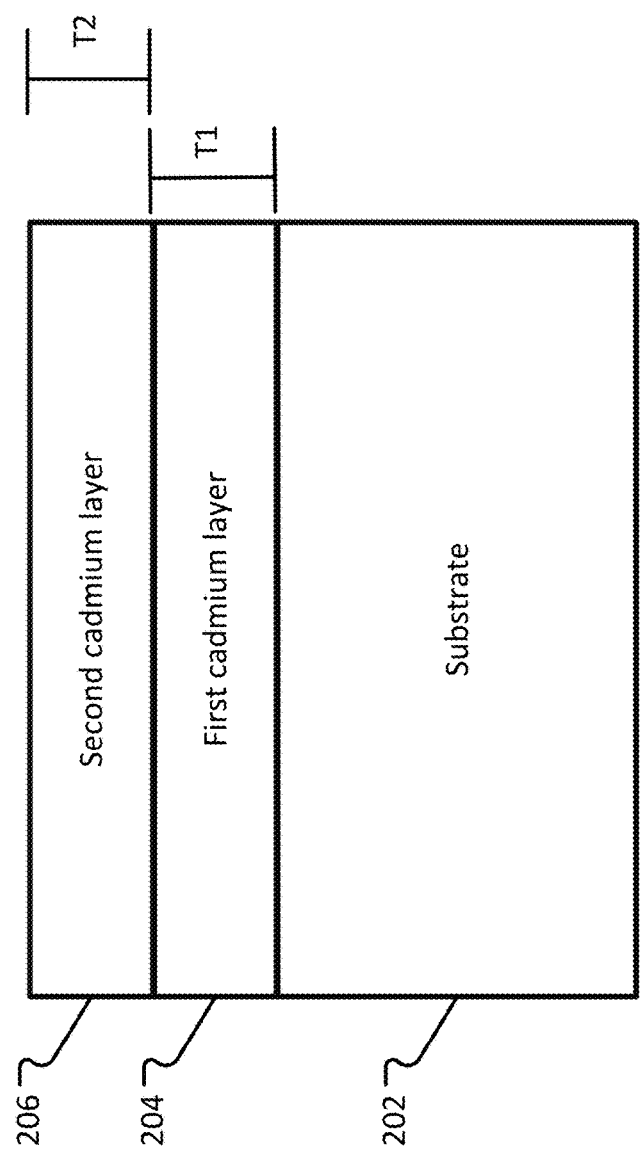
FIG. 2 shows a schematic illustration of a coated substrate made during the method of FIG. 1.
Figure 3:
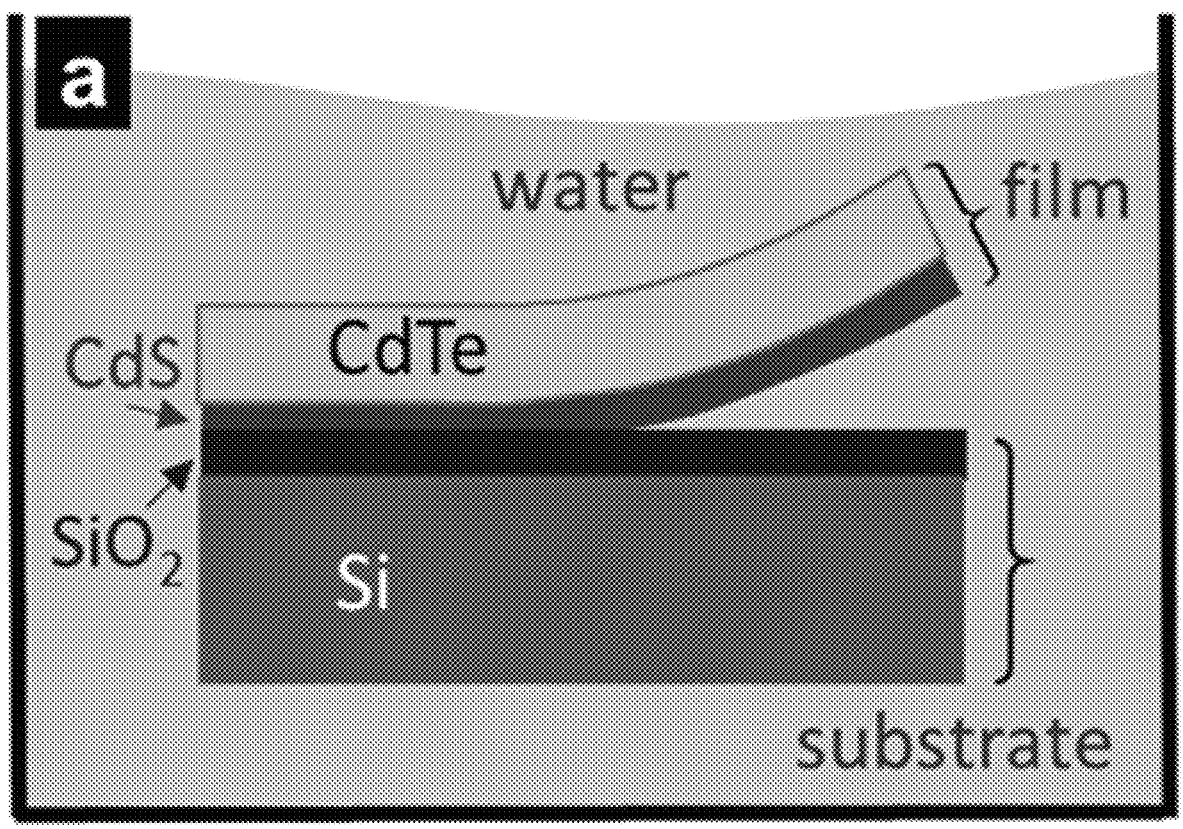
FIG. 3 shows a schematic illustration of the coated substrate in FIG. 2 during an immersion operation of the method shown in FIG. 1.

FIG. 1 shows example method 100 for making a thin film. Method 100 includes depositing a first cadmium layer (operation 102), depositing a second cadmium layer (operation 104), immersing coated substrate (operation 106), and removing a delaminated layer (operation 108). FIG. 2 is a schematic illustration of coated substrate 200 that may be generated after performance of operation 102 and operation 104. FIG. 3 is a schematic illustration of operations 106 and 108. FIGS. 2 and 3 are referenced below in conjunction with method 100. Other embodiments can include more or fewer operations.

Example method 100 begins by depositing a first cadmium layer 204 (operation 102) onto a substrate 202. In some embodiments, substrate 202 is silicon-based. As examples, substrate 202 can be silicon (Si) wafer or thermally oxidized silicon (Si/SiO$_2$) wafer. Substrate 202 can be of different thicknesses, depending upon the implementation. As examples, a silicon component of substrate 202 can have a thickness of 500 µm and a silicon oxide (SiO$_2$) component can have a thickness of 300 nm.

Typically, first cadmium layer 204 is deposited using a vapor deposition technique, such as thermal deposition. Various deposition rates can be used during operation 102. For instance, thermal deposition of first cadmium layer 204 can be performed at 0.4 nm·s$^{-1}$ to 0.6 nm·s$^{-1}$. In some embodiments, thermal deposition of first cadmium layer 204 can be performed at 0.5 nm·s$^{-1}$.

First cadmium layer 204 has thickness T1. Thickness T1 can vary in different implementations. For instance, thickness T1 can be 100 nm to 250 nm. In some instances, thickness T1 is no greater than 250 nm. In various implementations, thickness T1 can be 100 nm; 125 nm; 150 nm; 175 nm; 200 nm; 225 nm; or 250 nm.

In some implementations, the deposited first cadmium layer includes n-cadmium sulfide (CdS). In some implementations, the deposited first cadmium layer includes cadmium selenide (CdSe).

Depositing a first cadmium layer (operation 102) can be performed under ambient conditions. Generally, ambient conditions are known in the art, and can include atmospheric pressure and temperatures roughly about 20° C. to 25° C. A temperature of substrate 202 can be at ambient temperature (that is, about 20° C. to about 25° C.). In some instances, depositing a first cadmium layer (operation 102) can be performed at higher temperatures than ambient conditions, such as greater than 25° C. but less than 100° C. In some instances, depositing a first cadmium layer (operation 102) can be performed at lower temperatures than ambient conditions, such as greater than 0° C. but less than 20° C.

After depositing first cadmium layer 204 (operation 102), a second cadmium layer 206 is deposited (operation 104). Second cadmium layer 206 typically includes different components than first cadmium layer 204. Second cadmium layer 206 can include p-cadmium telluride (p-CdTe). After operation 104, a film is formed on substrate 202, where the film comprises the first cadmium layer 204 and the second cadmium layer 206

Depositing second cadmium layer (operation 104) usually involves a vapor deposition technique. Exemplary vapor deposition techniques include thermal deposition, thermal evaporation, sputtering, molecular beam epitaxy, and close-spaced sublimation (CSS).

Various deposition rates can be used during operation 104. For instance, thermal deposition of second cadmium layer 206 can be performed at 2.2 nm·s$^{-1}$ to 2.8 nm·s$^{-1}$. In some embodiments, thermal deposition of second cadmium layer 206 can be performed at 2.5 nm·s$^{-1}$.

Second cadmium layer 206 has thickness T2. Thickness T2 can vary in different implementations. For instance, thickness T2 can be 0.2 µm to 6 µm. In some instances, thickness T2 is no greater than 6 µm. In various implementations, thickness T2 can be 0.2 µm; 0.5 µm; 1 µm; 2 µm; 3 µm; 4 µm; 5 µm; or 6 µm.

Depositing a second cadmium layer (operation 104) can be performed at elevated temperatures of substrate 202. In some instances, after operation 102, substrate 202 is heated prior to depositing the second cadmium layer (operation 104). A temperature of substrate 202 during operation 104 is typically between 400° C. to 540° C. In some implementations, a temperature of substrate 202 during operation 104 is 400° C.; 425° C.; 450° C.; 475° C.; 500° C.; 525° C.; or 540° C.

After depositing the second cadmium layer (operation 104), a coated substrate is generated. The coated substrate is then immersed in an aqueous medium (operation 106). Usually, the aqueous medium is water, although other components may be present in the water in various implementations.

A temperature of the aqueous medium during operation 106 is usually ambient temperature. That is, the aqueous medium usually has a temperature of 20° C. to 25° C. prior to immersion of the coated substrate.

FIG. 3 illustrates, schematically, a coated substrate immersed in an aqueous medium. The film comprising CdS and CdTe is delaminating from the substrate that includes Si and $SiO_2$. While the coated substrate is immersed, delamination of the film occurs at the interface between the film (comprising the first cadmium layer 202 and the second cadmium layer 204) and the substrate 202. Typically, the film delaminates without application of physical force.

After delamination, the delaminated layer is removed (operation 108). At this point, the film (the delaminated layer) can be applied to a second substrate, where the second substrate is different from the substrate 202.

The second substrate can have applications such as optoelectronics and solar energy harvesting systems, such as solar-powered wearable electronics (clothing, tents, awnings, and other textiles), sustainable flexible displays (building integrated photovoltaics), and self-powered internet-of-things (IoT). In some instances, the second substrate can be a material that is temperature sensitive, such as a plastic, a fabric, and/or cellulose paper. Exemplary plastics include polycarbonate, polyimide, and polyethylene terephthalate (PET)). Other types of substrates are contemplated.

II. Experimental Examples

Examples of various aspects of systems, methods and techniques were evaluated experimentally. Results are discussed below.

A. Experimental Procedures

Procedures for film deposition, TEM sample preparation and measurement, SEM/grain analysis, x-ray photoelectron spectroscopy (XPS), and other thin-film characterizations are provided in the following sections.

1. Film Deposition

Prior to thin film deposition, thermally oxidized 3-inch Si wafers (300 nm thick $SiO_2$) were cleaned with acetone, isopropanol, and distilled water and blown dry. The Si/$SiO_2$ substrates were mounted by hand upside down. A polished 4-inch silicon wafer was placed on the substrate to act as a temperature stabilizer and a heater assembly was placed on the temperature stabilizer. A k-type thermocouple was placed on the center of the stabilizer to allow for proportional integral derivative (PID) control of the substrate's temperature. Molybdenum boats containing CdTe (5N Plus) and CdS (BDH Chemical) pellets were used for the evaporation. Film thickness was determined using an Inficon quartz crystal monitor.

At a base pressure of $4 \times 10^{-5}$ Torr (0.05 Pa), 200 nm thick CdS was first deposited at room temperature. The substrate temperature was then ramped to 450° C. at a rate of 15° C. $min^{-1}$. At a base pressure of $4 \times 10^{-5}$ Torr (0.05 Pa), CdTe was thermally evaporated until film thickness reached 4 μm. The deposition rate for CdS and CdTe was 0.5 $nms^{-1}$ and 2.5 $nms^{-1}$, respectively. Conventional $CdCl_2$ post-annealing treatments were conducted on a few selected samples (Si/$SiO_2$/CdS/CdTe). The samples were upside down in a graphite boat filled with $CdCl_2$ pellets (4N purity, Aldrich) and placed in a tube furnace. $N_2$ gas was flowed at a rate of approximately 50 sccm, and the samples were heated to 410° C. (10° C. $min^{-1}$) and annealed for 15 minutes.

2. TEM Sample Preparation and Measurement

Cross-sectional lift-out samples were prepared using a dual beam system (FEI Helios NanoLab 650). Pt protective layers were sequentially deposited over a rectangular area of 1 μm by 10 μm by electron beam (2 keV, 3.2 nA, 30 nm) and ion beam (30 keV, 230 pA, 1000 nm). A lift out proceeded over this rectangular area, and final lamellae measuring 7 μm by 13 μm and less than 100 nm thick was lifted and mounted to a copper TEM grid for examination. Atomic-scale structural and compositional measurements were performed with a 200 keV TEM system (JEOL JEM 2800) equipped with windowless Si drift detectors. These EDX detectors have a solid angle of 1.6 sr, over 10-fold higher sensitivity than that of conventional detector. In TEM, atomic high-resolution phase contrast images were collected with sub-nm resolution by precisely positioning in diffraction along zone axes for cubic CdTe. In STEM, a nanometer-size analytical probe with a total beam current of less than 110 pA was used to image and characterize the sample using the inelastically scattered electrons passing through the electron transparent sample to form a high angle annular dark field (HAADF) image, which is proportional to atomic mass.

Electron dispersive X-ray spectral (EDX) chemical imaging under these same STEM beam and imaging conditions was utilized to acquire the Cd-L, Te-L, S-K, O-K, Si-K, and Pt-L edges with the best achievable spatial and energy resolution for the microscope. The acquisition parameters to resolve quantitative EDX spectral images were identified by performing a single acquisition comprised of multiple second scans over 256 by 256 pixels with a kernel size of 3 by 3 pixels. Initial quantification of the collected EDX spectra utilized a Cliff-Lorimer thin film with absorbance correction and a nominal thin film thickness of 80 nm to calculate weighted atomic percent and net count spectral maps using a commercial software (Thermo Scientific NSS software). Weighted spectral images were then further processed and visualized using Origin.

3. SEM/Grain Analysis

Field-Emission Scanning Electron Microscopy (FE-SEM; FEI NanoLab and Quanta) images were collected on the samples mounted on Al stubs using conductive tapes. Grain size analysis was performed using the commercial software MIPAR (Materials Image Processing and Automated Reconstruction; MIPAR) based on input of optical microscopy and SEM images. Each imaging recipe in MIPAR consisted of a number of steps, including adaptively adjusting contrast, filtering, applying an adaptive threshold, segmenting grains, filling in holes, rejecting edge containing features, and reporting the statistics on grain size based on the major axis of a fitted oval. In the same consistent sequence of the specific imaging processing steps, the individual values and ranges per image were refined over the entire batch stack of images to check for consistency in mapping grains over all magnifications and fields of view inside the software. A systematic regression was further used to check for consistency between labelled features and original images to apply and report on the overall grain sizes and distributions for over the hundreds of grains measured.

4. X-Ray Photoelectron Spectroscopy (XPS)

A lifted-off CdS/CdTe thin-film stack was dried in air, and mounted on a highly doped silicon substrate using carbon tape. The Si/SiO$_2$ processing substrate, where the CdS/CdTe films were delaminated, was also mounted on the XPS holder along with a Si/SiO$_2$ control substrate. All samples were transferred to an XPS system (Kratos Axis Ultra; aluminum Kα source) and the chamber was pumped down. Survey scans were collected using a pass energy of 160 eV with a 1 eV step size, while high resolution scans were collected using a pass energy of 40 eV with a 0.1 eV step. Both were collected using the slot aperture and hybrid lens, giving an effective measurement area of 700 μm×300 μm. Fitting was performed using a commercial software (Casa-XPS).

5. Other Thin-Film Characterizations

Topography of CdTe samples were measured in a non-contact AFM mode (Bruker Dimension Icon). Each area (512 pixel×512 pixel) was scanned at 1 Hz using a silicon nitride cantilever. To measure the structure and crystallinity of CdS/CdTe film on Si/SiO$_2$, a wide-angle XRD system (Phillips X'Pert) with a Cu Kα (λ=0.154 nm) source was used. At a grazing incidence angle of 0.5°, the 2-theta (θ) scan was performed from 20° to 80°.

B. Discussion of Experimental Data

To study grain growth of CdTe films on Si/SiO$_2$, a series of thermal depositions were conducted at different substrate temperatures (200° C.~540° C.). Briefly, a CdS layer (≈200 nm) was thermally deposited at room temperature followed by CdTe evaporation (≈4 μm) at an elevated temperature. The deposition rate of CdS and CdTe films was approximately 0.5 nm s$^{-1}$ and 2.5 nm s$^{-1}$, respectively, producing a final configuration of Si (500 μm)/SiO$_2$ (300 nm)/CdS (200 nm)/CdTe (4 μm) prior to lift-off process (see sections below for detail). There was no CdTe deposition or adhesion with the substrate temperature above 540° C., mainly attributed to low adhesion or sticking coefficient of CdS and CdTe in this temperature range[27].

FIG. 4A-FIG. 4D show atomic force microscopy (AFM) images collected on the surface of CdTe. The morphology evolves from small grains (≈30 nm at 200° C.) to a more faceted structure at higher temperatures (≈7 μm at 540° C.). The root-mean-square surface roughness increased exponentially from ≈8 nm at 200° C. to ≈200 nm at 540° C. Qualitatively, the grain size of the thermally evaporated CdTe thin-film increased with temperature as observed in other physical vapor deposition methods.

Figure 5:
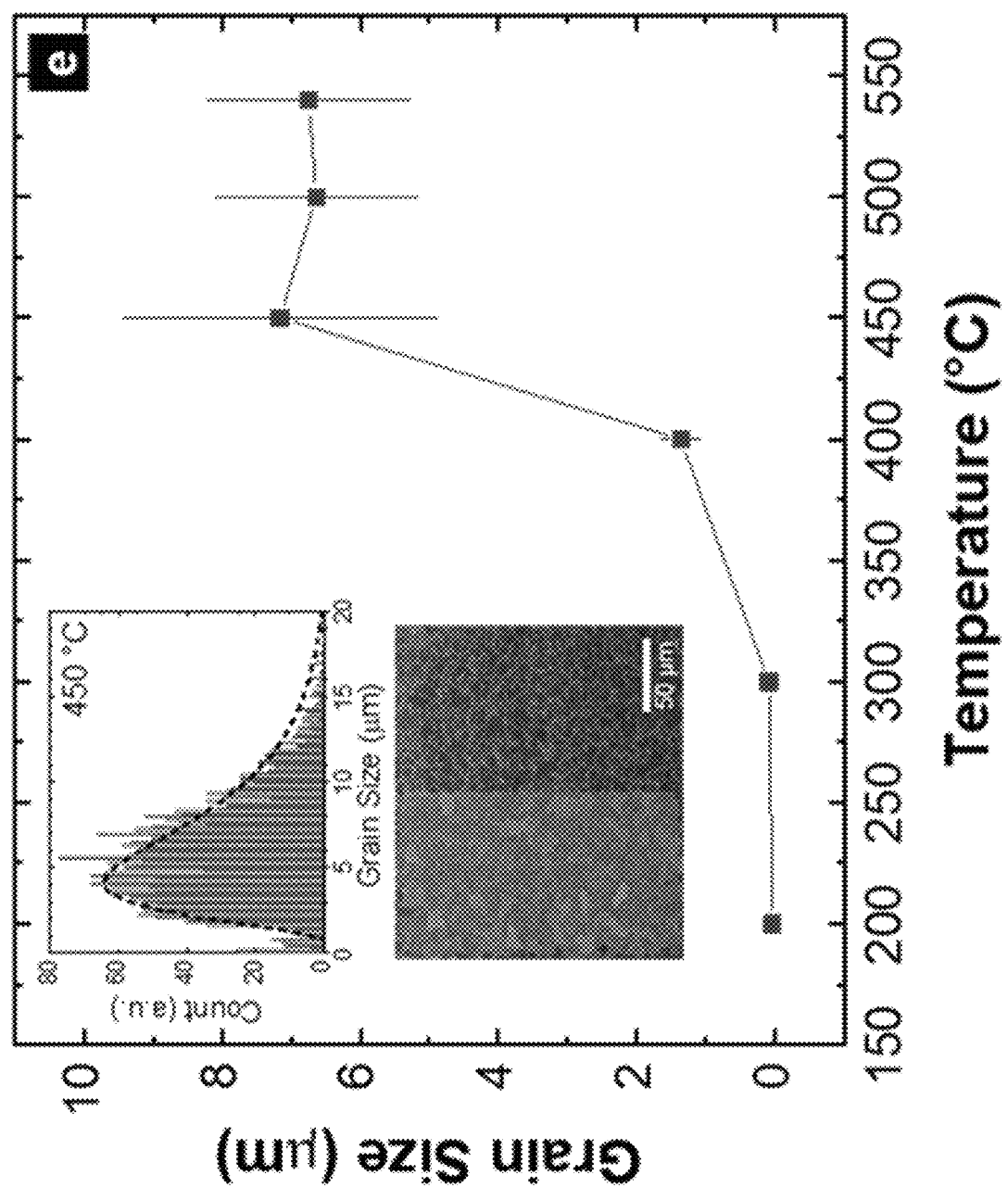
FIG. 5 shows a plot, for an experimental example, of the mean values of grain size at different substrate temperatures (error bars: one standard deviation). The inset shows the MIPAR processed data overlaid on an SEM image, and the statistics based on the MIPAR analysis. A fit of lognormal distribution was used to extract the mean value and standard deviation (black dot line).

To evaluate evolution of CdTe grains on Si/SiO$_2$ substrates, grain analysis was performed using image processing algorithms and show the statistical results in FIG. 5. Each imaging process of MIPAR (Materials Image Processing and Automated Reconstruction) included of a number of steps including adaptively adjusting contrast and threshold, filtering, segmenting grains, filling in holes, rejecting edge containing features, and binning of grain size based on major axis of a defined ellipse. A systematic regression was further applied for the consistency between labelled features and original images (see the Experimental section for detail).

An example of the processed MIPAR overlaid on a scanning electron microscopy (SEM) image and a lognormal fit of the grain size distribution (black dot line) are shown in the inset of FIG. 5. Grain growth of CdTe thin-film has been described by a structure zone model, where a needle-like structure (low temperature; regime 1) grows to a well-defined pyramidal shape (intermediate temperature; regime 2) and equiaxed structure (high temperature; regime 3). In experimental CdTe films, the first regime was apparent at temperatures lower than 350° C. A bimodal distribution of the grain size at 450° C. (the inset of FIG. 5) would be associated with the second and third regimes. The nominal grain size increases exponentially up to ≈450° C., and saturates at approximately 7 μm under experimental deposition conditions. This grain size is much larger than those in CdTe films on glass/FTO deposited by close-space sublimation and sputtering techniques (typical size of ≈1 μm).

Figure 6:
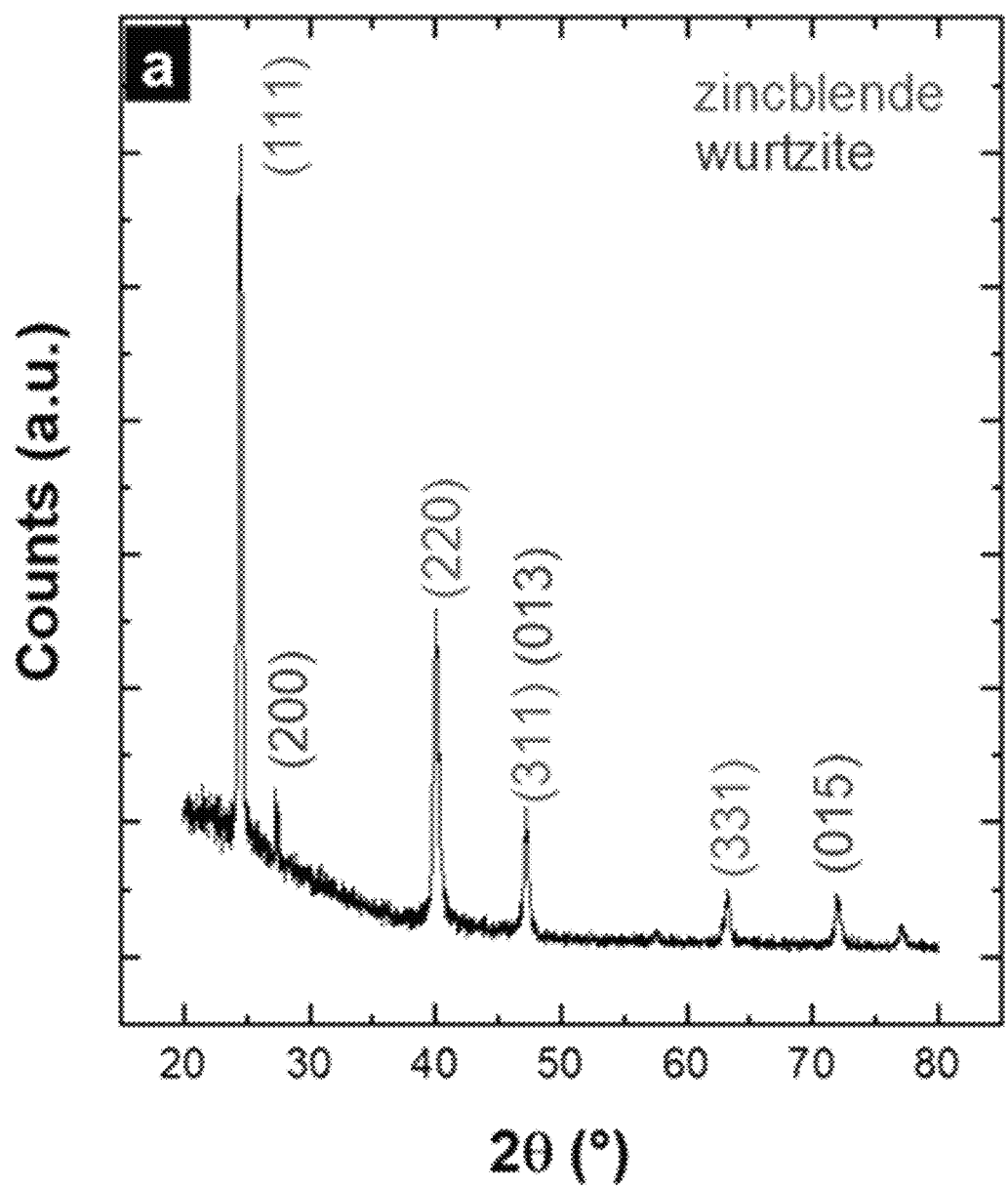
FIG. 6 shows x-ray diffraction XRD data collected on a $Si/SiO_2/CdS/CdTe$ experimental example prepared at a substrate temperature of 450° C. The peaks were indexed for CdTe zincblende cubic phase, while the wurtzite phases were also labeled for the less than 8% weight percentage.

Having established deposition conditions and the integrity of CdTe films, grazing incident x-ray diffraction (XRD) experiments were performed and the material structure was tracked in detail. FIG. 6 shows the XRD data collected on the CdTe film synthesized with a substrate temperature of 450° C. Based on the diffraction profiles, there is no sign of partial crystallinity other than the SiO$_2$ amorphous substrate, confirming that the CdTe film is fully crystallized. The Miller indices are provided for the CdTe zincblende cubic phase, while the wurtzite phases are also labeled for the less than 8% weight percentage based on Reitveld refinement performed inside the GSAS-II (Crystallography Data Analysis Software).

The zincblende phase can be indexed to a cubic-type crystal structure belonging to the Fd-3m space group, and is indexed to a cubic primitive unit cell corresponding to a=b=c=0.638 nm, α=δ=β=90° unit cell dimensions. The wurtzite phase can be indexed to a hexagonal type crystal structure belonging to the P63mc space group and corresponds to a=b=0.467 nm and c=0.765 nm Å, α=β=90° and δ=120°. In addition to the strong peak of (111), the presence of significant (220) and (311) is evident in the XRD patterns, consistent with those peaks in high-quality CdTe thin-films synthesized by close-space sublimation.

Figure 7A:
FIG. 7A and FIG. 7B show representative cross-sectional TEM images of the sample in FIG. 6. A series of SAED patterns collected on the area marked in grains (1, 3), grain boundaries (2), and twins (4), indicating [220], [400], and [220] out-of-plane crystal orientations.
Figure 7B:
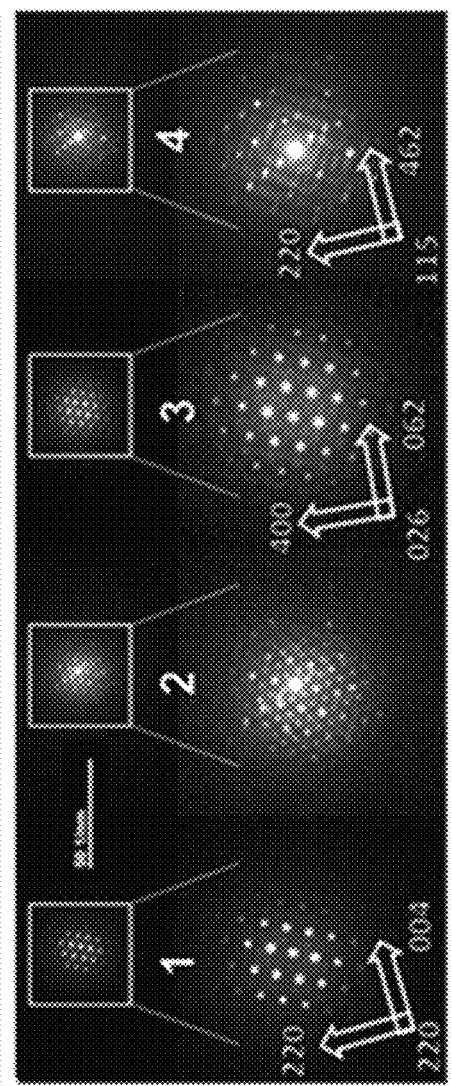

Acquired from four selected areas of a cross-sectional CdTe lamella in a transmission electron microscope (TEM), a series of selective area diffraction patterns (SAED) show the crystallinity and specific orientations relationship between individual grains (FIG. 7A and FIG. 7B). Preferentially oriented along [220] zone axes configuration for grain 1, the orientation relationship with the neighboring grains were defined as (004)(062) (interface normal)/{220}{004} (in plane directions) and (004)(462) (interface normal)/{220}{220} (in plane directions).

Figure 8:
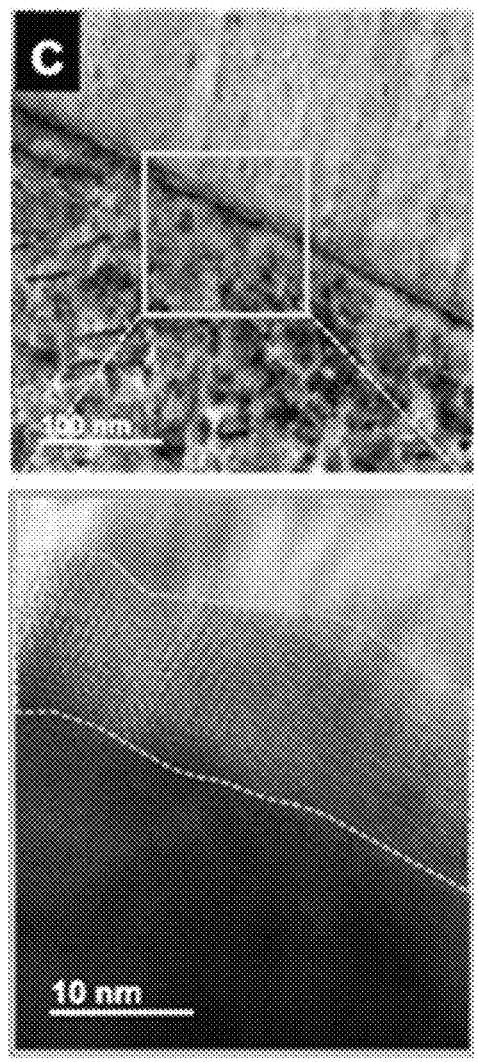
FIG. 8 shows a higher-magnification TEM image (than the images in FIGS. 7A and 7B), with a presence of unique intergranular crystallization of CdTe grown on a CdS coated $Si/SiO_2$ substrate.

The diffraction pattern for grain 4 implies a twin structure, which is commonly seen in conventional CdTe thin-films. These indicate that the zincbende crystalline structure is dominant in this CdTe film, showing a good agreement with the XRD result. Close inspection of the microstructures reveals distinct intergranular structures at/near grain boundaries. As seen in a representative image in FIG. 8, the width of the intergranular structure is approximately 10 nm to 20 nm, and it is present along the entire grain boundary. It is hypothesized that this unique feature can be attributed to a secondary phase formation during grain growth and coarsening there is accommodating lattice mismatch between neighboring grains, which might also be related to the small portion of wurtzite signature observed in the XRD (FIG. 6).

It was observed that this fine structure at/near grain boundaries disappeared after conventional $CdCl_2$ post-annealing treatment.

Inspection of chemical integrity of CdS/CdTe thin-films measured by dual energy dispersive x-ray spectroscopy (EDX) detectors is displayed in FIG. 9A-FIG. 9D. To resolve quantitative EDX spectral images, a single acquisition was performed comprising multiple second scans over 256 by 256 pixels with a kernel size of 3 by 3 pixels. The Cliff-Lorimer model with absorbance correction and a nominal thin-film thickness of 80 nm were used to calculate the net count and the weighted atomic percent. Overall the Cd-L, Te-L, and S-K EDX maps show highly uniform compositions of each layer, closely resembling the intended CdS/CdTe configuration. There is no significant change in stoichiometry at/near the intergranular structures in the CdTe film. The Te-L map reveals a distinct Te layer at the interface of CdS and $SiO_2$ (FIG. 9D) that has not been seen in conventional CdS/CdTe on FTO-coated glass substrates.

Figure 10:
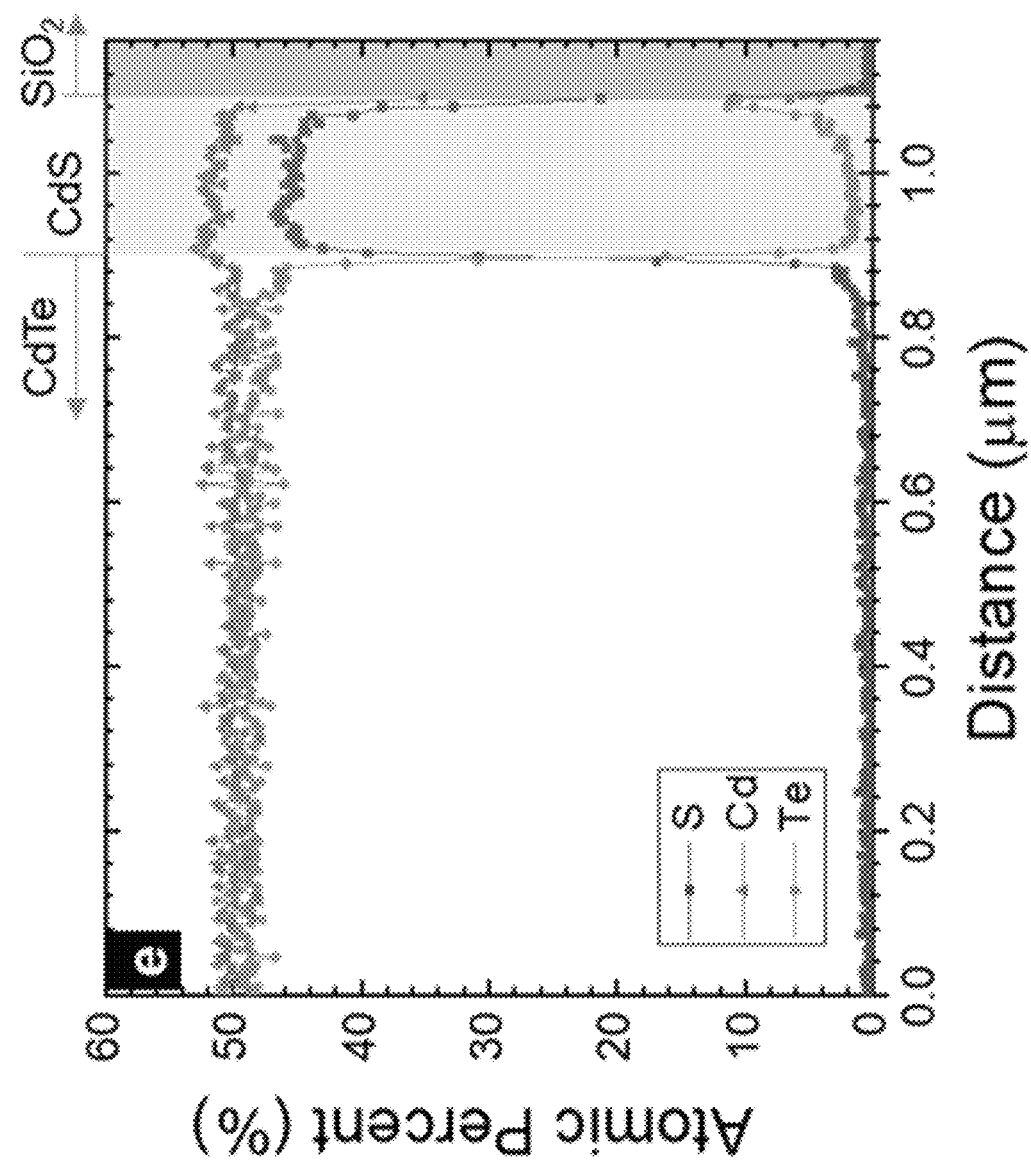
FIG. 10 shows line scans constructed using the Cliff Lorimer algorithm.
Figures 11A, 11B:
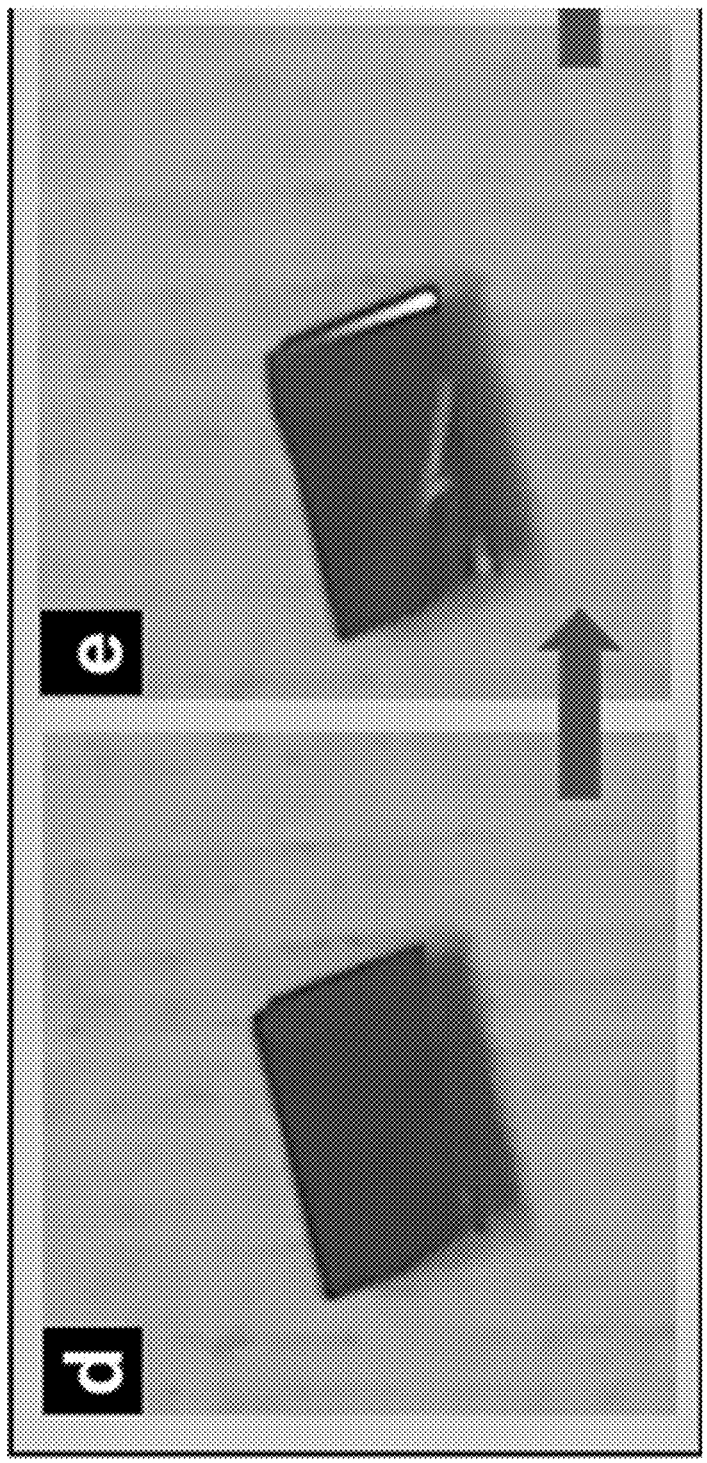
FIG. 11A-FIG. 11D are photographs taken at various stages during an experimental example of a lift-off process from an example embodiment of a coated substrate.
Figures 11C, 11D:
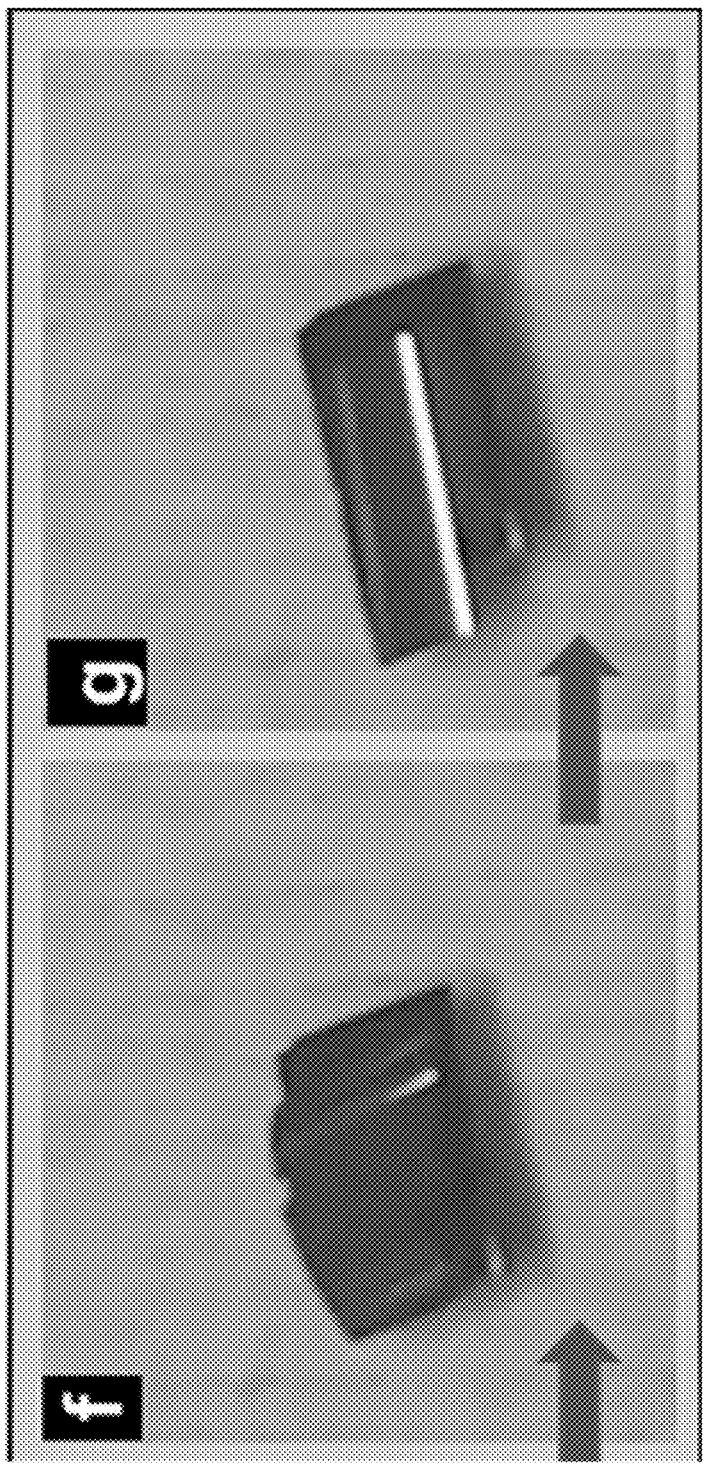

For a quantitative analysis, a linescan of each component was constructed by averaging the net counts of the EDX maps (FIG. 10). The signature of Te atoms is extended to the entire CdS layer ($\approx$2 at. %) while they are accumulated ($\approx$10 at. %) within an approximately 20 nm thick film at the $CdS/SiO_2$ interface. This interdiffusion of sulfur (S) and tellurium (Te) is often observed in CdS/CdTe systems, as S vacancies near the interface can be substituted by the migration of Te during high-temperature processing.

The intermixed layer of $CdS_{(x)}Te_{(1-x)}$ would relax the structural stress at the CdS (wurtzite)/CdTe (zincblende) interface otherwise existing about 10% lattice mismatch. The high Te accumulation on the SiO2 surface ($\approx$10 at. %) is likely attributed to the stronger bonds between Si—O than Si-chalcogen atoms (S, Te), and a larger atomic radius of Te (0.130 nm) that is at least three times bigger than the natural voids of $SiO_2$. It is thought that the presence of this Te-rich layer (20 nm-thick) would promote the delamination of CdS/CdTe films from a $Si/SiO_2$ substrate in water, discussed in the following section.

Figure 12B:
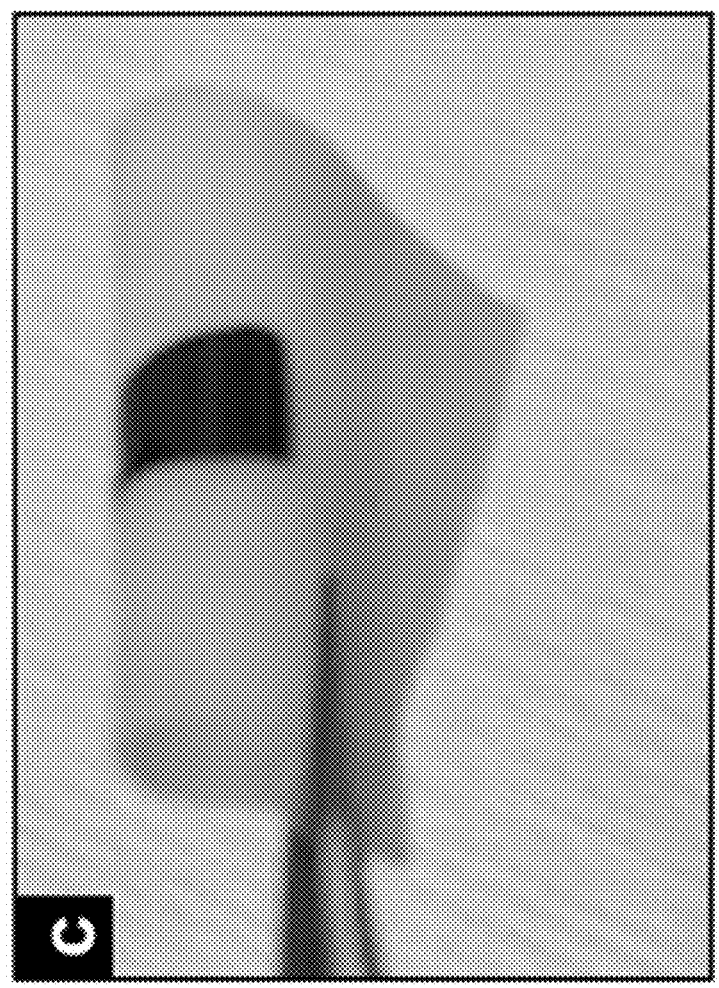
FIG. 12B shows an example CdS/CdTe film transferred onto a fabric substrate.
Figure 12A:
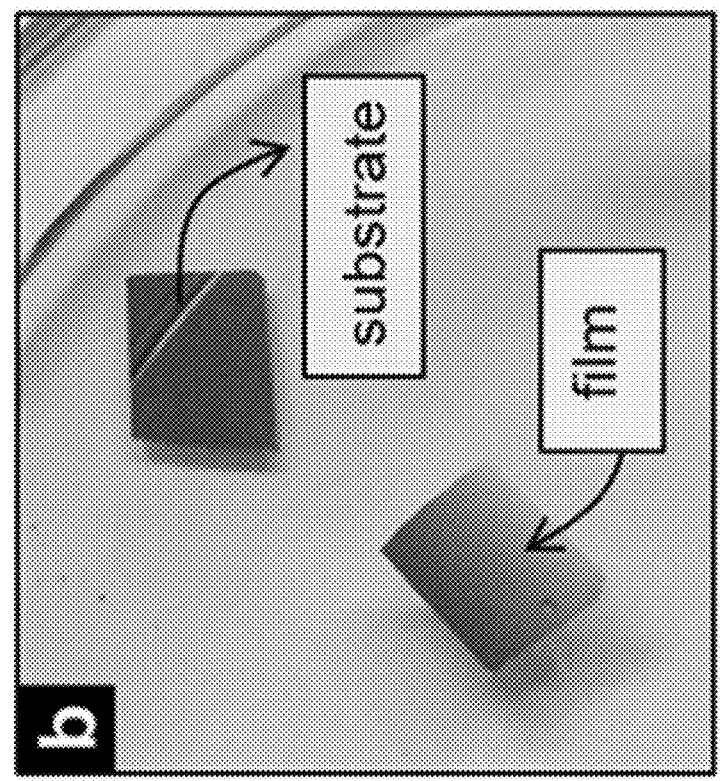
FIG. 12A is a photograph of an example CdS/CdTe film lifted off from a substrate.

A series of photographs were taken on a representative sample during lift-off of CdS/CdTe film in a water environment at room temperature, shown in FIG. 11A-FIG. 11D. Resulting film after lift off is shown in FIG. 12A and the film of FIG. 12A is shown positioned on a fabric substrate in FIG. 12B.

FIGS. 11A-11D show that delamination starts from the edge to the center, and the whole film ($\approx$8 mm by 4 mm) is completely separated from the substrate within a few seconds. The interfacial delamination was also observed in other liquid solutions, including isopropyl alcohol, acetone, and methanol, but deionized water at room temperature was the most cost-effective, safe, and compatible to foreign substrates to be transferred, primarily used in this study.

As a control experiment, lift-off of CdS film deposited on $Si/SiO_2$ substrate was performed without a CdTe layer. The CdS film ($\approx$5 mm×5 mm) was rather broken into many small pieces (<a few mm×mm) during the lift-off. Lift-off of the film stack was also attempted on other conventional substrates, including FTO coated glass, glass slides, and bare Si wafers, where the CdS/CdTe films were deposited under the same evaporation condition (450° C.). However, no notable delamination was observed on these substrates, indicating that an atomically flat and well-grown oxide layer may be required for lift-off processes. Owing to high flexibility, the lifted-off CdS/CdTe film stack can be assembled to various foreign materials, including highly curved substrates (e.g., FIG. 12B on fabric) that have a limited temperature tolerance.

Figures 13A, 13B:
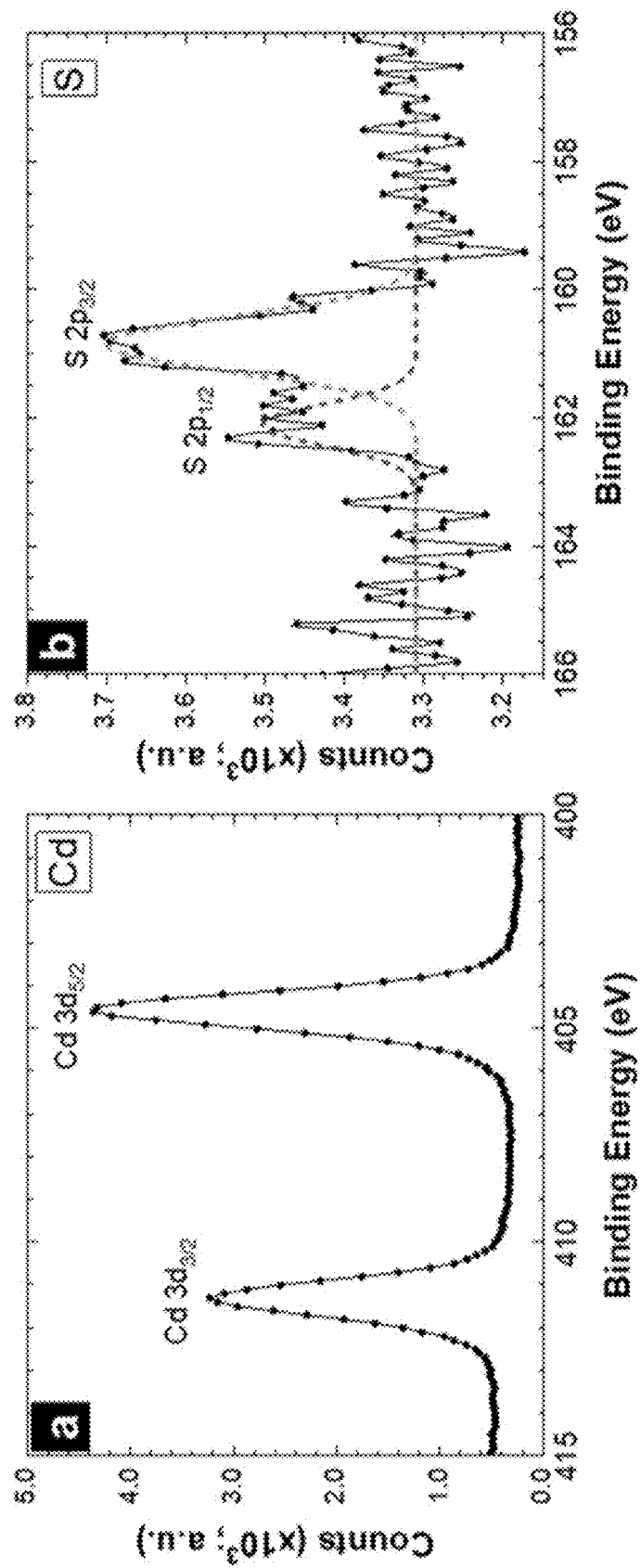
FIG. 13A-FIG. 13C show high-resolution XPS data collected on the delaminated CdS/CdTe film (CdS side) for Cd (FIG. 13A), S (FIG. 13B), and Te (FIG. 13C), supporting the presence of Te in the CdS layer.
Figure 13D:
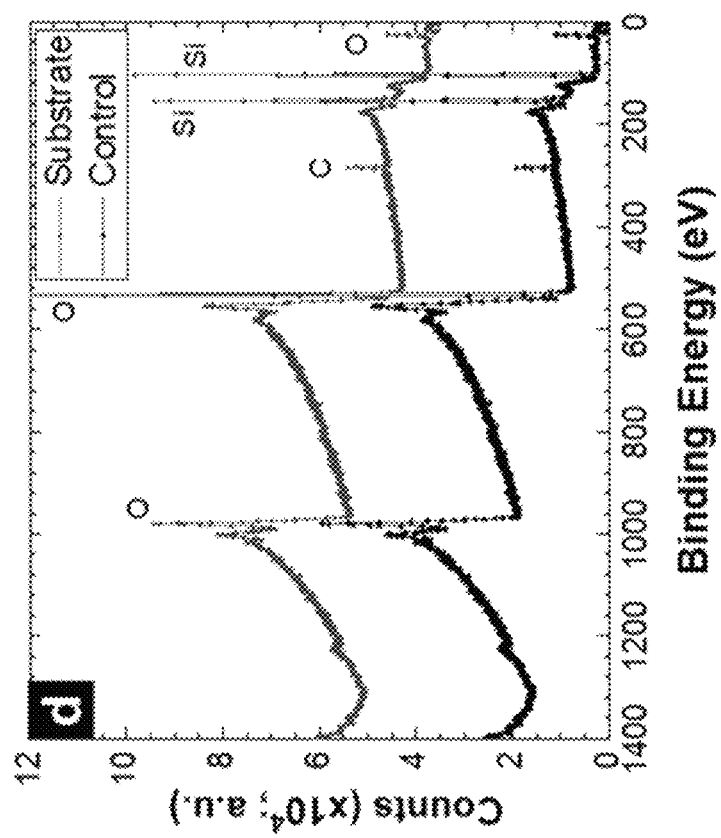
FIG. 13D shows a broad range of XPS survey scan on the $Si/SiO_2$ substrate.
Figure 13C:
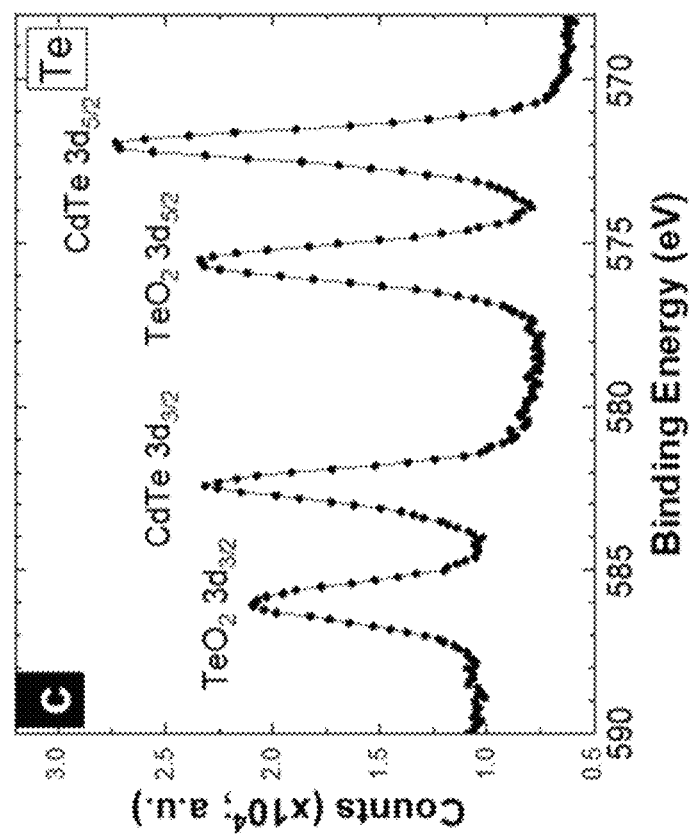

Surface sensitive X-ray photoelectron spectra (XPS) collected on the CdS/CdTe films (CdS side) and the $Si/SiO_2$ substrate ($SiO_2$ side) confirm that the delamination occurred at the $CdS/SiO_2$ interface (FIG. 13A-FIG. 13D). For the CdS/CdTe film, the expected signatures of Cd and S were seen at 411 eV (Cd $3d_{3/2}$) and 405 eV (Cd $3d_{5/2}$), and 168 eV (S $2p_{3/2}$) and 161 eV (S $2p_{1/2}$), respectively. The peak around 570 eV indicates the presence of Te (Te $3d_{5/2}$) in the CdS layer, consistent with the EDX result in FIG. 9A-FIG. 9D. The weak signal at 575.6 eV ($TeO_2$) can be attributed to the oxidation of the film in air after the delamination. FIG. 13B shows the XPS of the $Si/SiO_2$ processing wafer after delamination in comparison to that of $Si/SiO_2$ control, showing no significant differences. Additional higher resolution XPS on the processing wafer do not show any signature of Cd, Te, or S, indicating that the physically liberated CdS/CdTe films leave no residue on the $Si/SiO_2$ substrate. In principle, the processing $Si/SiO_2$ wafer can be recycled multiple times without any post cleaning processes, potentially lowering the overall manufacturing cost of freestanding CdTe-based materials and devices.

The experimental results qualitatively suggest that the water-assisted lift-off of CdS/CdTe thin-films may be attributed to two mechanisms: stress-induced deformation and strain-facilitated chemical debonding. First, as described by the Stoney formula, multilayer film on a rigid substrate remain in stress, the tendency toward curvature in that system. While the large lattice mismatch between CdS and CdTe (approximately 10%) is relaxed during the high-temperature deposition process via interdiffusion of S and Te (FIG. 9A-FIG. 9D), some mismatch strain is likely still present. This innate compressive stress of the film would induce the delamination from the bulk substrate with a natural curved shape in FIG. 11D. Second, the presence of rich-Te layer at the $SiO_2$ interface appears to mediate the lift-off process in water, a similar behavior observed at the interface of Ni and $Si/SiO_2$ in water. In previous studies, it was suggested that the debonding process of thin-film nanoelectronic devices built on a Ni-based layer is attributed by the elasto-plastic deformation of adherent thin films as well as a hydrolysis reaction between the solvent and the metal-oxygen bond. Considering a large-scale transfer of thin-film nanoelectronic devices in the Ni-based system, the instant lift-off method for CdS/CdTe based system can be extended for mass production for a wide range of optoelectronics and solar energy harvesting systems.

The experimental results demonstrated water-assisted lift-off of CdTe thin-films, synthesized on an oxidized Si wafer, is compatible with high-temperature processing (>450° C.). The grain size of the CdTe films increased with deposition temperature, and the crystallinity of the microstructures were similar to those synthesized via close-spaced sublimation and physical vapor deposition methods. In contrast to conventional CdS/CdTe on $SnO_2$/glass, it was found that Te atoms of the CdTe film can diffuse through the CdS layer and accumulate onto $SiO_2$ layer. The presence of the Te-rich layer (20 nm-thick) and the lattice mismatch with the atomically flat $SiO_2$ would promote the gentle delamination of the whole stack of CdS/CdTe layers in water at room temperature. The high-resolution electron microscopy, x-ray photoluminescence, photoluminescence results support that the delaminated freestanding CdS/CdTe films preserve their initial optical, structural, and compositional properties.

Unless otherwise defined, all technical and scientific terms used herein have the same meaning as commonly understood by one of ordinary skill in the art. In case of conflict, the present document, including definitions, will control. Example methods and materials are described below, although methods and materials similar or equivalent to those described herein can be used in practice or testing of the present disclosure. The materials, methods, and examples disclosed herein are illustrative only and not intended to be limiting.

The terms "comprise(s)," "include(s)," "having," "has," "can," "contain(s)," and variants thereof, as used herein, are intended to be open-ended transitional phrases, terms, or words that do not preclude the possibility of additional acts or structures. The singular forms "a," "an" and "the" include plural references unless the context clearly dictates otherwise. The present disclosure also contemplates other embodiments "comprising," "consisting of" and "consisting essentially of," the embodiments or elements presented herein, whether explicitly set forth or not.

For the recitation of numeric ranges herein, each intervening number there between with the same degree of precision is explicitly contemplated. For example, for the range of 6-9, the numbers 7 and 8 are contemplated in addition to 6 and 9, and for the range 6.0-7.0, the number 6.0, 6.1, 6.2, 6.3, 6.4, 6.5, 6.6, 6.7, 6.8, 6.9, and 7.0 are explicitly contemplated. For example, when a pressure range is described as being between ambient pressure and another pressure, a pressure that is ambient pressure is expressly contemplated.

The invention claimed is:

1. A method of making a thin film, the method comprising:
    depositing a first cadmium layer onto a substrate;
    depositing a second cadmium layer onto the first cadmium layer, wherein a thickness of the second cadmium layer is between 0.2 µm to 6 µm, thereby generating a coated substrate;
    immersing the coated substrate in an aqueous medium; and
    after immersing the coated substrate, removing a delaminated layer from the substrate, the delaminated layer including the first cadmium layer and the second cadmium layer.

2. The method according to claim 1, further comprising applying the delaminated layer to a second substrate.

3. The method according to claim 2, the second substrate being selected from a plastic, a fabric, and a cellulose paper.

4. The method according to claim 1, wherein a thickness of the first cadmium layer is no greater than 200 nm.

5. The method according to claim 1, wherein depositing the second cadmium layer includes a vapor deposition technique.

6. The method according to claim 5, wherein the vapor deposition technique is thermal evaporation.

7. The method according to claim 1, wherein a substrate temperature is 20° C. to 25° C. while the first cadmium layer is deposited onto the substrate.

8. The method according to claim 7, wherein the substrate temperature is at least 400° C. and no more than 540° C. while the second cadmium layer is deposited onto the substrate.

9. The method according to claim 1, wherein the first cadmium layer includes cadmium sulfide (CdS).

10. The method according to claim 1, wherein the first cadmium layer includes cadmium selenide (CdSe).

11. The method according to claim 1, wherein the second cadmium layer includes cadmium telluride (CdTe).

12. The method according to claim 1, wherein an aqueous medium temperature is at ambient temperature before immersing the coated substrate in the aqueous medium.

13. The method according to claim 1, wherein the substrate includes silicon material.

14. A method of making a thin film, the method comprising:
    depositing a first cadmium layer onto a substrate,
        wherein a substrate temperature is 20° C. to 25° C. while the first cadmium layer is deposited onto the substrate;
    depositing a second cadmium layer onto the first cadmium layer, thereby generating a coated substrate,
        wherein the substrate temperature is at least 400° C. and no more than 540° C. while the second cadmium layer is deposited onto the substrate;
    immersing the coated substrate in an aqueous medium; and
    after immersing the coated substrate, removing a delaminated layer from the substrate without application of physical force, the delaminated layer including the first cadmium layer and the second cadmium layer.

15. The method according to claim 14, further comprising applying the delaminated layer to a second substrate, the second substrate being selected from a plastic, a fabric, and a cellulose paper,
    wherein an aqueous medium temperature is at ambient temperature before immersing the coated substrate in the aqueous medium.

16. The method according to claim 15, wherein a thickness of the first cadmium layer is no greater than 250 nm;
    wherein a thickness of the second cadmium layer is between 0.2 µm to 6 µm;
    wherein depositing the second cadmium layer includes a vapor deposition technique;
    wherein the first cadmium layer includes cadmium sulfide (CdS) or cadmium selenide (Cd Se);
    wherein the second cadmium layer includes cadmium telluride (CdTe); and
    wherein the substrate includes silicon material.

* * * * *